(12) United States Patent
Hirohata

(10) Patent No.: US 9,882,118 B2
(45) Date of Patent: Jan. 30, 2018

(54) SPIN CONTROL MECHANISM AND SPIN DEVICE

(71) Applicants: JAPAN SCIENCE AND TECHNOLOGY AGENCY, Kawaguchi-shi, Saitama (JP); The University of York, York (GB)

(72) Inventor: Atsufumi Hirohata, York (GB)

(73) Assignees: JAPAN SCIENCE AND TECHNOLOGY AGENCY, Kawaguchi-Shi (JP); THE UNIVERSITY OF YORK, York (GB)

( * ) Notice: Subject to any disclaimer, the term of this patent is extended or adjusted under 35 U.S.C. 154(b) by 0 days.

(21) Appl. No.: 15/032,679

(22) PCT Filed: Oct. 29, 2014

(86) PCT No.: PCT/JP2014/078816
§ 371 (c)(1),
(2) Date: Apr. 28, 2016

(87) PCT Pub. No.: WO2015/064663
PCT Pub. Date: May 7, 2015

(65) Prior Publication Data
US 2016/0268497 A1    Sep. 15, 2016

(30) Foreign Application Priority Data
Oct. 31, 2013    (JP) .................................. 2013-227153

(51) Int. Cl.
*H01L 43/08* (2006.01)
*H01L 43/02* (2006.01)
(Continued)

(52) U.S. Cl.
CPC ................ *H01L 43/02* (2013.01); *B81B 5/00* (2013.01); *H01L 23/3675* (2013.01); *H01L 43/08* (2013.01); *H02K 49/06* (2013.01)

(58) Field of Classification Search
CPC .......... B81B 5/00; H01L 43/02; H01L 43/08; H01L 23/3675; H02K 49/06
See application file for complete search history.

(56) References Cited

U.S. PATENT DOCUMENTS 7,324,309 B1 *    1/2008  Wiesen .................. B82Y 25/00
                                                     360/319
7,385,790 B2 *    6/2008  Inomata ................. B82Y 10/00
                                                     257/E27.005
(Continued)

FOREIGN PATENT DOCUMENTS

EP        2 551 913 A1    1/2013
JP        2006-107513 A   4/2006
(Continued)

OTHER PUBLICATIONS

K. Uchida et al., "Spin Seebeck insulator", Nature Materials, vol. 9, No. 11, pp. 894-897 (Nov. 2010).
(Continued)

*Primary Examiner* — Sophia Nguyen

(57) ABSTRACT

A spin control mechanism includes a spin portion and a first channel portion. The spin portion has a magnetic moment that can be reversed and rotated. The first channel portion is provided in contact with the spin portion, and is configured from ferromagnetic insulator. Then, the spin control mechanism controls a direction of the magnetic moment of the spin portion using a spin current generated by a temperature gradient provided to the first channel portion.

10 Claims, 11 Drawing Sheets

(51) Int. Cl.
  *B81B 5/00* (2006.01)
  *H01L 23/367* (2006.01)
  *H02K 49/06* (2006.01)

(56) References Cited

U.S. PATENT DOCUMENTS

| | | | | |
|---|---|---|---|---|
| 7,485,937 B2* | 2/2009 | Tokura | | B82Y 10/00 257/421 |
| 7,675,129 B2* | 3/2010 | Inomata | | G11B 5/3903 257/421 |
| 7,764,136 B2* | 7/2010 | Suzuki | | H01L 43/08 257/421 |
| 9,196,268 B2* | 11/2015 | Iwasaki | | G11B 5/11 |
| 9,396,743 B1* | 7/2016 | Zheng | | G11B 5/3909 |
| 9,406,875 B2* | 8/2016 | Li | | G11C 11/161 |
| 9,548,634 B2* | 1/2017 | Hirohata | | H01L 29/66984 |
| 2003/0174446 A1* | 9/2003 | Hasegawa | | B82Y 10/00 360/319 |
| 2004/0057295 A1* | 3/2004 | Matsukawa | | B82Y 10/00 365/200 |
| 2004/0100855 A1* | 5/2004 | Saito | | B82Y 10/00 365/232 |
| 2005/0068698 A1* | 3/2005 | Sato | | B82Y 10/00 360/324.12 |
| 2006/0291107 A1* | 12/2006 | Sbiaa | | G01R 33/093 360/324.12 |
| 2006/0291108 A1* | 12/2006 | Sbiaa | | B82Y 10/00 360/324.12 |
| 2007/0014054 A1* | 1/2007 | Zhang | | B82Y 40/00 360/324.12 |
| 2007/0228501 A1* | 10/2007 | Nakamura | | B82Y 25/00 257/421 |
| 2007/0241410 A1* | 10/2007 | Umehara | | B82Y 10/00 257/379 |
| 2007/0279809 A1* | 12/2007 | Myiauchi | | G11B 5/3163 360/324.1 |
| 2008/0024934 A1* | 1/2008 | Uesugi | | B82Y 25/00 360/313 |
| 2008/0285180 A1* | 11/2008 | Tanaka | | B82Y 10/00 360/319 |
| 2009/0015376 A1* | 1/2009 | Xiang | | G06K 19/0672 340/10.1 |
| 2010/0097063 A1* | 4/2010 | Ando | | B82Y 10/00 324/316 |
| 2010/0148167 A1* | 6/2010 | Whig | | B82Y 25/00 257/43 |
| 2010/0188905 A1* | 7/2010 | Poeppel | | B82Y 25/00 365/185.28 |
| 2010/0237448 A1* | 9/2010 | Shin | | H01L 27/228 257/421 |
| 2010/0244897 A1* | 9/2010 | Saito | | G11C 11/16 326/49 |
| 2010/0276770 A1* | 11/2010 | Uchida | | G01K 7/36 257/421 |
| 2012/0032287 A1* | 2/2012 | Li | | B82Y 10/00 257/421 |
| 2012/0070693 A1* | 3/2012 | Abarra | | B82Y 10/00 428/811.2 |
| 2012/0133007 A1* | 5/2012 | Kimura | | G11C 11/16 257/421 |
| 2012/0138115 A1* | 6/2012 | Chen | | H01L 35/32 136/205 |
| 2012/0139069 A1* | 6/2012 | Kim | | H01L 27/228 257/421 |
| 2012/0177902 A1* | 7/2012 | Driscoll | | C01G 49/009 428/216 |
| 2012/0326252 A1* | 12/2012 | Yamakawa | | H01L 27/222 257/421 |
| 2013/0037892 A1* | 2/2013 | Park | | H01L 43/12 257/421 |
| 2013/0062785 A1* | 3/2013 | Lin | | H01L 21/56 257/778 |
| 2013/0063853 A1* | 3/2013 | Lin | | H01L 21/56 361/91.7 |
| 2013/0119494 A1* | 5/2013 | Li | | H01L 43/08 257/421 |
| 2013/0154633 A1 | 6/2013 | Fujiwara et al. | | |
| 2014/0182645 A1* | 7/2014 | Kirihara | | H01L 37/00 136/201 |
| 2014/0197505 A1* | 7/2014 | Zhou | | H01L 23/552 257/422 |
| 2014/0327096 A1* | 11/2014 | Guo | | H01L 43/10 257/421 |
| 2015/0021726 A1* | 1/2015 | Min | | H01L 43/02 257/421 |
| 2015/0085569 A1* | 3/2015 | Nozaki | | H01L 29/66984 365/158 |
| 2015/0129995 A1* | 5/2015 | Wang | | G11C 11/18 257/421 |
| 2015/0200003 A1* | 7/2015 | Buhrman | | G11C 11/18 365/158 |
| 2015/0249206 A1* | 9/2015 | Kim | | H01L 43/02 257/421 |
| 2016/0087194 A1* | 3/2016 | Itoh | | H01L 43/08 257/421 |
| 2016/0268497 A1* | 9/2016 | Hirohata | | H01L 43/08 |
| 2016/0277017 A1* | 9/2016 | Lin | | H01L 23/4952 |
| 2017/0062712 A1* | 3/2017 | Choi | | H01L 45/1233 |
| 2017/0069837 A1* | 3/2017 | Choi | | H01L 43/12 |
| 2017/0104151 A1* | 4/2017 | Banerjee | | H01L 43/065 |

FOREIGN PATENT DOCUMENTS

| | | |
|---|---|---|
| JP | 2007-005802 A | 1/2007 |
| JP | 2007-266498 A | 10/2007 |
| JP | 2012-099720 A | 5/2012 |
| JP | 2013-045840 A | 3/2013 |
| WO | 2009/066631 A1 | 5/2009 |
| WO | 2011/004891 A1 | 1/2011 |
| WO | 2012/161336 A1 | 11/2012 |

OTHER PUBLICATIONS

International Search Report received for PCT Patent Application No. PCT/JP2014/078816 dated Nov. 25, 2014, 2 pages.

The International Bureau of WIPO, "Notification of Transmittal of Translation of the International Preliminary Report on Patentability," issued in International Application No. PCT/JP2014/078816, of which U.S. Appl. No. 15/032,679 is a U.S. national phase entry, dated May 12, 2016, 11 pages.

European Patent Office, "Partial Supplementary European Search Report," issued in European Patent Application No. 14 857 027.8, which is a European counterpart of U.S. Appl. No. 15/032,679, dated Jun. 6, 2017, 11 pages.

Ken-ichi Uchida et al., "Observation of longitudinal spin-Seebeck effect in magnetic insulators", Applied Physics Letters AIP Publishing LLC U.S., vol. 97, No. 17, Oct. 29, 2010, pp. 172505-1—172505-3.

European Patent Office, Extended European Search Report, issued in EP Patent Application No. EP14 857 027.8, which is a European counterpart of U.S. Appl. No. 15/032,679, with an issuance date of Oct. 11, 2017, 9 pages.

* cited by examiner

Fig.1
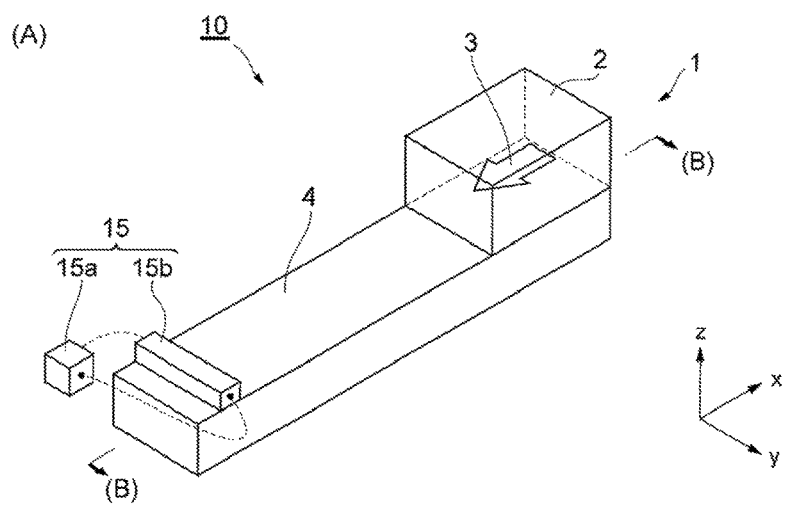
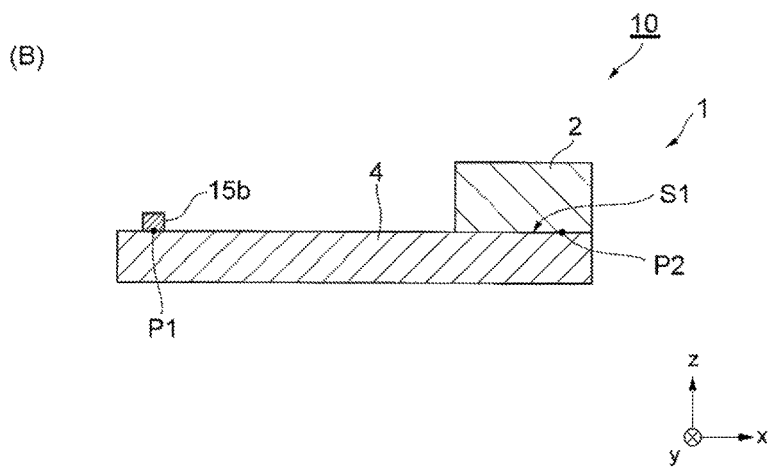

SPIN CONTROL MECHANISM AND SPIN DEVICE

CROSS REFERENCE TO RELATED APPLICATIONS

This patent application is a U.S. national stage application under 35 U.S.C. §371 of International Patent Application No. PCT/JP2014/078816 filed on Oct. 29, 2014, which claims the benefit of foreign priority to Japanese Patent Application No. JP 2013-227153 filed on Oct. 31, 2013. The International Application was published in Japanese on May 7, 2015, as International Publication No. WO 2015/064663 A1 under PCT Article 21(2).

TECHNICAL FIELD

The present invention relates to a spin control mechanism and a spin device.

BACKGROUND ART

Heat generated from electronic components in electronic devices may be a cause that hinders normal operations of the electronic devices. Therefore, conventionally, mechanisms that adjust the temperature of electronic components are known (for example, see Patent Literature 1). Patent Literature 1 below describes a heatsink and a fan as the mechanism that adjusts the temperature of electronic components.

CITATION LIST

Patent Literature

Patent Literature 1: Japanese Patent Application Laid-open Publication No. 2006-107513

SUMMARY OF INVENTION

Technical Problem

Here, the inventor has calculated volumes, weights, and power consumption ratios of principal components in a lap-top computer provided with the mechanism that adjusts the temperature of electronic components. A memory device used in this computer is DRAM. As illustrated in FIG. 11, in the lap-top computer, the weight of the fan and the heatsink occupies about 20% of the weight of the entire computer, and the power consumption of the fan occupies about 10% of the power consumption of the entire computer.

As described above, the existence of the mechanism that adjusts the temperature of electronic components has a substantial influence on downsizing or energy saving of the computers. Therefore, employment of a spin electronic element having a smaller size and a smaller calorific value than the DRAM can be considered to suppress the volume, the weight, and the power consumption of the mechanism that adjusts the temperature of electronic components. However, the above measurement can make heat discharge capability of the mechanism that adjusts the temperature of electronic components small only by the amount of the weight or the calorific value that is smaller than the DRAM. In the field of the present technology, a new device that enables further downsizing or energy saving of the mechanism that adjusts the temperature of electronic components is desired.

Solution to Problem

The inventor has considered that the heat generated in the electronic components can be used for the operations of the electronic components if he/she can invent a device that is operated using heat. That is, the inventor has considered that heat to be exhausted itself can be decreased by inventing the device operable by heat, and as a result, the mechanism that adjusts the temperature of electronic components can be downsized or energy-saved, and the inventor has arrived at the present invention.

A spin control mechanism according to one aspect of the present invention includes a spin portion and a first channel portion. The spin portion has a magnetic moment. The first channel portion is provided in contact with the spin portion, and is configured from a ferromagnetic insulator. The spin control mechanism then controls a direction of the magnetic moment of the spin portion using a spin current generated by a temperature gradient provided to the first channel portion.

In this spin control mechanism, the temperature gradient is provided to the first channel portion. When the temperature gradient exists in the ferromagnetic insulator, spin is excited in the ferromagnetic insulator by the spin Seebeck effect and a spin current is generated. That is, the spin current is generated toward the spin portion by the temperature gradient of the first channel portion, so that the magnetic moment of the spin portion can be controlled. Therefore, for example, by use of heat generated in other electronic components as a heat generating source, the mechanism that adjusts the temperature of other electronic components can be further downsized or energy-saved.

In the spin control mechanism according to an embodiment, the temperature gradient in which a temperature becomes lower toward a contact position of the first channel portion and the spin portion may be provided to the first channel portion. With such a temperature gradient, the spin current is generated in the first channel portion toward the spin portion. Therefore, the generated spin current can change the direction of the magnetic moment of the spin portion.

In the spin control mechanism according to an embodiment, a gradient of a thickness may be formed in the first channel portion such that the thickness becomes thinner from a predetermined position of the first channel portion toward the contact position of the first channel portion and the spin portion. With the configuration, the temperature gradient can be efficiently formed from the predetermined position of the first channel portion toward the contact position. Therefore, the magnetic moment of the spin portion can be efficiently controlled.

In the spin control mechanism according to an embodiment, a predetermined position of the first channel portion and a heat generating source may be thermally connected in order to provide the temperature gradient between the predetermined position of the first channel portion and a contact position where the first channel portion and the spin portion are in contact with each other. With the configuration, the heat is conducted from the heat generating source to the predetermined position of the first channel portion, and the temperature gradient is generated between the predetermined position of the first channel portion configured from the ferromagnetic insulator and the contact position of the first channel portion with the spin portion.

In the spin control mechanism according to an embodiment, the heat generating source may generate Joule heat. In an embodiment, the heat generating source may be a heatsink connected to another electronic device. In this case, by use of heat generated in other electronic components, the mechanism that adjusts the temperature of other electronic components can be further downsized or energy-saved.

A spin device according to one aspect of the present invention is a spin device operated by a spin current. The spin device includes a spin portion, a spin injector, a first channel portion, and a second channel portion. The spin portion has a magnetic moment. The spin injector is provided separated from the spin portion, and is made of a magnetic body. The first channel portion is provided in contact with the spin portion, and is configured from a ferromagnetic insulator. The second channel portion is arranged between the spin injector and the spin portion, and is made of a nonmagnetic body joined with the spin injector and the spin portion directly or through an insulating layer. The spin device then controls a direction of the magnetic moment of the spin portion using at least one of a spin current generated in the first channel portion by a temperature gradient provided to the first channel portion, and a spin current generated in the second channel portion by application of a current or a voltage to the spin injector and the second channel portion.

In the spin device, for example, when a current or a voltage is applied to the spin injector made of a ferromagnetic body and the second channel portion made of a nonmagnetic body, a spin current is generated in the second channel portion toward the spin portion made of a ferromagnetic body. The spin flowing in the second channel portion acts on the magnetic moment of the spin portion as spin-transfer torque. Here, a spin current is generated in the first channel portion by the spin Seebeck effect by the temperature gradient provided to the first channel portion. The spin current acts on the magnetic moment of the spin portion as the spin-transfer torque. Accordingly, the magnetic moment of the spin portion can be more easily rotated by the spin current of the first channel portion. That is, a spin device that can easily rotate a magnetic moment using heat can be realized. Therefore, for example, by use of heat generated in other electronic components, the mechanism that adjusts the temperature of other electronic components can be further downsized or energy-saved.

In the spin device according to an embodiment, the temperature gradient in which a temperature becomes lower toward a contact position of the first channel portion and the spin portion may be provided to the first channel portion. With such a temperature gradient, the spin current is generated in the first channel portion toward the spin portion. Therefore, the generated spin current can change the direction of the magnetic moment of the spin portion.

In the spin device according to an embodiment, a gradient of a thickness may be formed in the first channel portion such that the thickness becomes thinner from a predetermined position of the first channel portion toward a contact position of the first channel portion and the spin portion. With the configuration, the temperature gradient can be efficiently formed from the predetermined position of the first channel portion toward the contact position. Therefore, the magnetic moment of the spin portion can be efficiently controlled.

In a spin device according to an embodiment, a predetermined position of the first channel portion and a heat generating source may be thermally connected to provide a temperature gradient between the predetermined position of the first channel portion and a contact position where the first channel portion and the spin portion are in contact with each other. With the configuration, heat is conducted from the heat generating source to the predetermined position of the first channel portion, and the temperature gradient is generated from the predetermined position of the first channel portion configured from a ferromagnetic insulator and the contact position in the first channel portion with the spin portion.

In the spin device according to an embodiment, the heat generating source may generate heat by Joule heat. In an embodiment, the heat generating source may be a heatsink connected to another electronic device. In this case, by use of heat generated in other electronic components, the mechanism that adjusts the temperature of other electronic components can be further downsized or energy-saved.

The spin device according to an embodiment further includes: a substrate; wherein the spin portion is a disk-like member made of a ferromagnetic body provided on the substrate, and the spin injector may be provided on the substrate, being separated from the spin portion, and may be made of a ferromagnetic body magnetized in an in-substrate direction.

With the configuration, in a case where the spin portion is a disk-like shape, magnetic anisotropy of the spin portion in the in-substrate direction can be made uniform. Therefore, the magnetic moment of the spin portion in the in-substrate direction can be easily controlled.

A spin device according to another aspect of the present invention includes a spin valve structure. The spin valve structure includes a pinned layer, a free layer, and an intermediate layer. In the pinned layer, a direction of a magnetic moment is fixed. The free layer is arranged facing the pinned layer, and can change the direction of a magnetic moment. The intermediate layer is arranged between the pinned layer and the free layer, and is made of a tunnel barrier layer or a nonmagnetic layer. Then, the spin device includes a potential difference generating portion and a first channel portion. The potential difference generating portion provides a potential difference between the pinned layer and the free layer. The first channel portion is made of a ferromagnetic body insulator, and is arranged in contact with sides of the pinned layer, the intermediate layer, and the free layer.

The spin valve structure provides the potential difference to the intermediate layer sandwiched by the pinned layer and the free layer, by the potential difference generating portion, thereby to function as a switch element or a memory element having a different detection signal according to the direction of the magnetic moment of the free layer. Here, the intermediate layer is made of a tunnel barrier layer or a nonmagnetic layer. Further, when a voltage is applied by the potential difference generating portion, Joule heat is generated, and a temperature difference is caused between the pinned layer and the free layer. With this temperature difference, the temperature gradient is caused in the first channel portion being in contact with the pinned layer and the free layer. With the temperature gradient, a spin current is generated in the first channel portion. This spin current acts on the magnetic moment of the free layer as spin-transfer torque. Therefore, the magnetic moment of the free layer can be controlled by the spin current of the first channel portion. That is, by use of heat generated by a voltage for signal detection, a spin device that can easily rotate a magnetic moment of a free layer can be realized. As described above, the first channel portion can use the heat generated in the electronic component, and thus the mechanism that adjusts the temperature of electronic components can be further downsized or energy-saved.

In the spin control mechanism according to an embodiment, a temperature gradient in which a temperature becomes lower toward a contact position of the first channel portion and the free layer may be provided to the first channel portion. With such a temperature gradient, a spin current is generated in the first channel portion toward the free layer. Therefore, the generated spin current can change the direction of the magnetic moment of the free layer.

In the spin device according to an embodiment, a gradient of a thickness may be formed in the first channel portion such that the thickness becomes thinner from the side of the pinned layer toward the contact position of the first channel portion and the free layer. With the configuration, the temperature gradient can be efficiently formed from the predetermined position toward the contact position of the first channel portion. Therefore, the magnetic moment of the spin portion can be efficiently controlled.

In the spin device according to an embodiment, the potential difference generating portion may generate Joule heat in the spin valve structure, and the first channel portion may be provided with a temperature gradient from the side of the pinned layer toward a contact position of the first channel portion and the free layer by the Joule heat generated in the spin valve structure.

Advantageous Effects of Invention

As described above, according to the various aspects of the present invention and various embodiments, a spin control mechanism and a spin device that control spin using heat are provided.

BRIEF DESCRIPTION OF DRAWINGS

FIG. 1 is a schematic view illustrating a configuration of a spin device according to a first embodiment.

DESCRIPTION OF EMBODIMENTS

Figure 2:
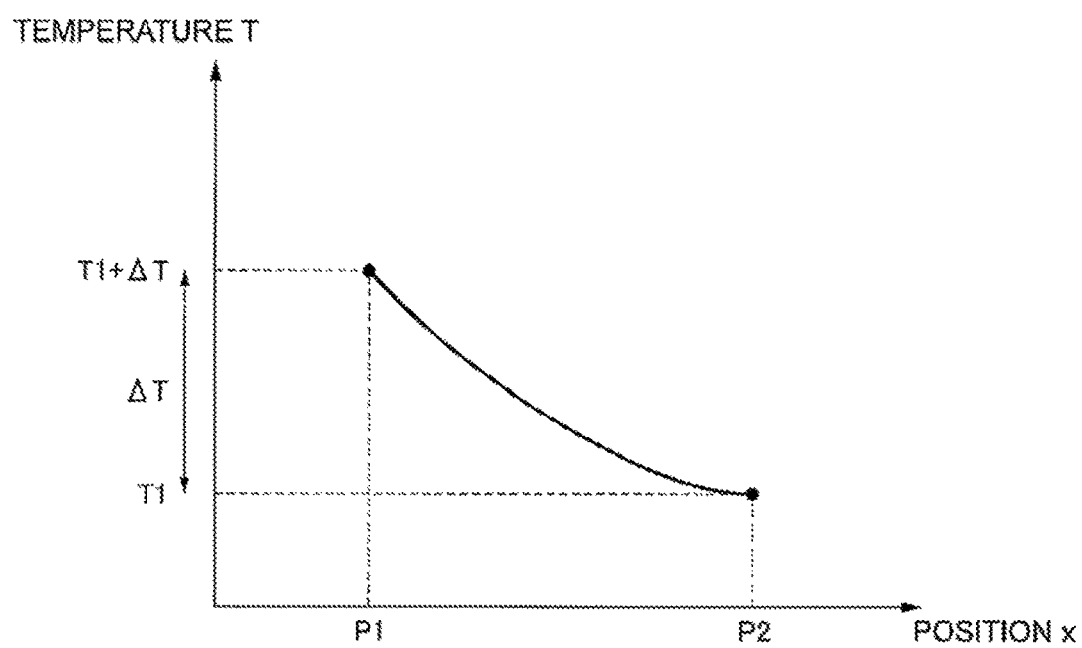
FIG. 2 is a graph for describing a temperature gradient.

Hereinafter, embodiments will be specifically described with reference to the appended drawings. Note that, in the description of drawings, the same element is denoted with the same reference sign, and overlapping description is omitted. Further, dimension ratios of the drawings do not necessarily accord with the description.

First Embodiment

A spin device according to the present embodiment will be described with reference to FIG. 1. FIG. 1 is a schematic view illustrating a configuration of a spin device according to an embodiment. (A) in FIG. 1 is a perspective view and (B) in FIG. 1 is a side sectional view.

The spin device is a nanoscale device that reverses a magnetic moment using a spin current. Here, as an example of the spin device, a spin device that reverses the magnetic moment by application of a so-called spin Seebeck effect will be described. The spin Seebeck effect is a phenomenon in which the spin current is generated when a temperature difference is given to a magnetic body.

As illustrated in FIG. 1, the spin device 10 includes a spin control mechanism 1. The spin control mechanism 1 includes a spin portion 2 and a first channel portion 4.

The spin portion 2 has a magnetic moment 3 that can be reversed and rotated. That is, the spin portion 2 is configured from a magnetic body. The spin portion 2 is configured from a ferromagnetic body, for example. Here, the spin device 10 has a configuration in which a detection signal is changed according to a magnetizing direction of the magnetic moment 3 of the spin portion 2. That is, the spin device 10 has a configuration that can detect a signal that distinguishes at least a first state (for example, an ON state) and a second state (for example, an OFF state) according to the magnetizing direction of the spin portion 2.

The spin portion 2 is in direct contact with the first channel portion 4 without other intervening members. The spin portion 2 and the first channel portion 4 are in contact, so that a contact surface S is formed. Note that the size of the contact surface S1 is not limited, and the spin portion 2 and the first channel portion 4 may be in contact at one point, for example. Hereinafter, the point included in the contact surface S1 is referred to as contact position P2.

The first channel portion 4 is an insulator configured from a ferromagnetic body. The first channel portion 4 is a linear member having a longitudinal direction. The first channel portion 4 is arranged such that the longitudinal direction extends along an x direction. The spin portion 2 is arranged on one end portion of the first channel portion 4.

A temperature gradient is given to the first channel portion 4. The temperature gradient means existence of a temperature difference according to a position. For example, heat generating source 15 is thermally connected to the other end portion (a predetermined position P1) of the first channel portion 4. The predetermined position P1 is a position to which the heat generating source 15 is thermally connected. The predetermined position P1 exists on the first channel portion 4, and is separated from the contact position P2. Thermally connected means a state where heat can be conducted between two substances. Accordingly, the heat is conducted from the heat generating source 15 to the first channel portion 4, and a temperature gradient is provided.

The heat generating source 15 may be a member that generates heat by Joule heat, a member that generates heat by other factors, or a member itself to which the heat has already been conducted. The heat generating source 15 may be a heatsink that is connected to another electronic device, and radiates heat of the electronic device. In the present embodiment, as the heat generating source 15, a power supply 15a and a resistance member 15b are employed. The power supply 15a is configured to apply a voltage to the resistance member 15b. The power supply 15a is connected to a control unit, and may be configured to be able to turn ON/OFF the voltage application. When the voltage is applied to the resistance member 15b, the resistance member 15b generates the Joule heat. The generated heat increases the temperature of the first channel portion 4 in the predetermined position P1. FIG. 2 is a graph illustrating a relationship between the position of the first channel portion 4 and the temperature. When the heat is provided from the heat generating source 15 to the predetermined position P1, the temperature in the predetermined position P1 increases by ΔT, as illustrated in FIG. 2. That is, the temperature of the predetermined position P1 becomes T1+ΔT, where the temperature of the contact position P2 is T1. Accordingly, a temperature difference ΔT is caused between the predetermined position P1 and the contact position P2, and the temperature gradient is caused between the predetermined position P1 and the contact position P2. This temperature gradient is a temperature gradient in which the temperature is decreased from the predetermined position P1 toward the contact position P2. That is, the predetermined position P1 is connected with the heat generating source 15, so that the temperature gradient is caused between the predetermined position P1 and the contact position P2.

Figure 3:
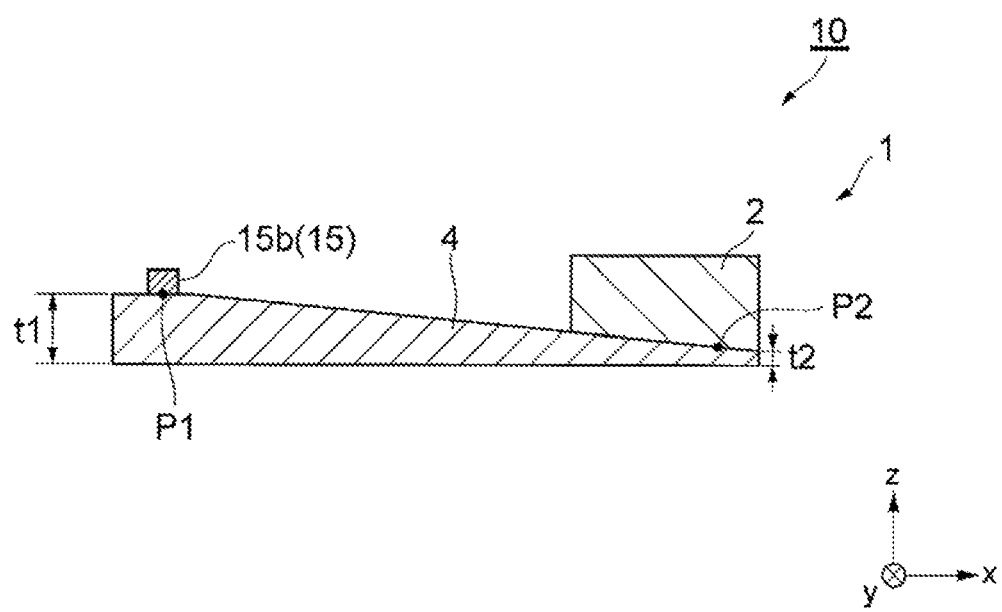
FIG. 3 is a diagram for describing a thickness of a first channel portion.

In one embodiment, a gradient of a thickness of the first channel portion 4 may be formed such that the thickness becomes thinner as the first channel portion 4 goes from the predetermined position P1 toward the contact position P2. FIG. 3 is a diagram for describing an example of the thickness of the first channel portion 4. As illustrated in FIG. 3, a thickness t1 of the first channel portion 4 in the predetermined position P1 to which the heat generating source 15 is connected may be thicker than a thickness t2 of the contact position P2 being in contact with the spin portion 2. Then, the thickness of the first channel portion 4 may be gradually thinner toward the contact position P2 being in contact with the spin portion 2. With the configuration, heat capacity of each position is changed from the predetermined position P1 toward the contact position P2. Therefore, the temperature gradient can be efficiently formed from the predetermined position P1 to the contact position P2 of the first channel portion 4. Accordingly, making the temperature of the predetermined position P1 higher than the temperature of the contact position P2 can be easily realized, for example. Therefore, the magnetic moment 3 of the spin portion 2 can be efficiently controlled.

Next, an operation of the spin device 10 will be described. First, in a case of controlling the direction of the magnetic moment 3 of the spin portion 2, the heat is supplied from the heat generating source 15 to the predetermined position P1 of the first channel portion 4. Accordingly, the temperature gradient is generated between the predetermined position P1 and the contact position P2. Since the first channel portion 4 is configured from a ferromagnetic insulator, the spin is excited in the ferromagnetic insulator and a spin current is generated by the spin Seebeck effect. The spin current flows from the predetermined position P1 toward the contact position P2 having a lower temperature than the predetermined position P1. This spin current acts on the magnetic moment 3 of the spin portion 2 as spin-transfer torque. Accordingly, the direction of the magnetic moment 3 of the spin portion 2 is controlled.

As described above, according to the spin control mechanism 1 according to the first embodiment, the magnetic moment 3 of the spin portion 2 can be controlled using the heat. Therefore, the mechanism that adjusts the temperature of electronic components can be used for downsizing and power saving. For example, by use of the heat generated from another electronic component as heat generating source 15, the mechanism that adjusts the temperature of electronic components can be further downsized or energy-saved.

Further, according to the spin control mechanism 1 according to the first embodiment, the first channel portion 4 may be formed such that the thickness becomes thinner from the predetermined position P1 toward the contact position P2. With the configuration, the temperature gradient can be efficiently formed from the predetermined position P1 to the contact position P2 of the first channel portion. Therefore, the magnetic moment 3 of the spin portion 2 can be efficiently controlled.

Second Embodiment

A spin device 10 according to a second embodiment includes a spin control mechanism 1 similar to the spin device according to the first embodiment. The spin device 10 of the second embodiment is different from the spin device of the first embodiment in that the spin device 10 of the second embodiment is a spin motor by application of a so-called spin valve structure. Therefore, points overlapping with the description of the first embodiment are omitted, and the different point will be mainly described.

Figure 4:
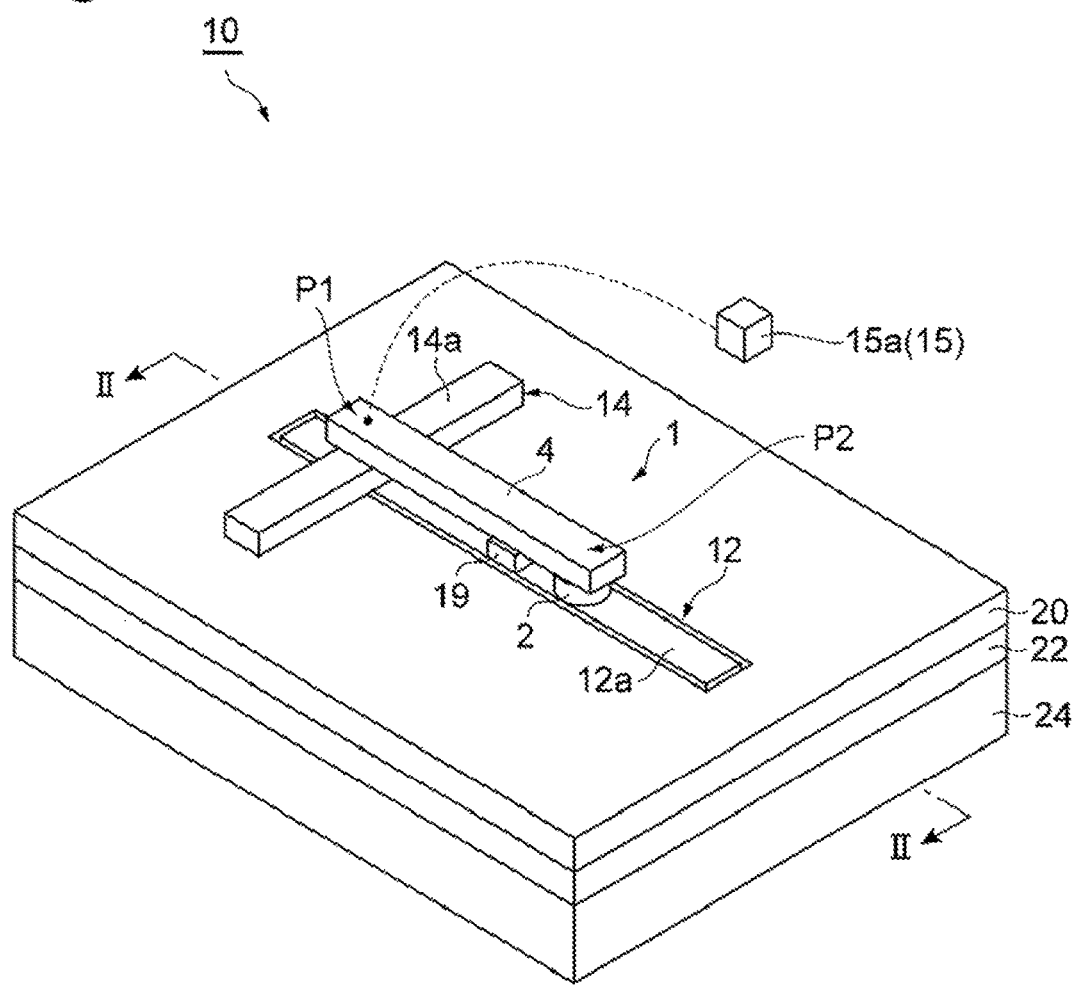
FIG. 4 is a perspective view of a spin device according to a second embodiment.
Figure 5:
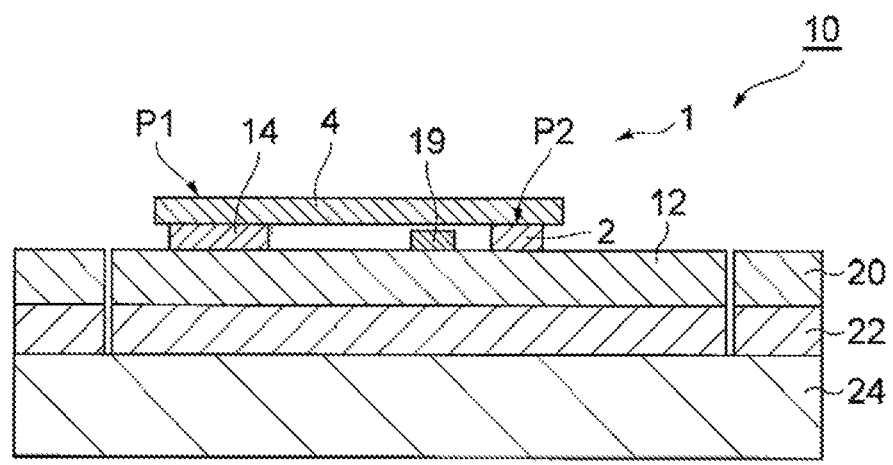
FIG. 5 is a sectional view along line II-II of FIG. 4.
Figure 6:
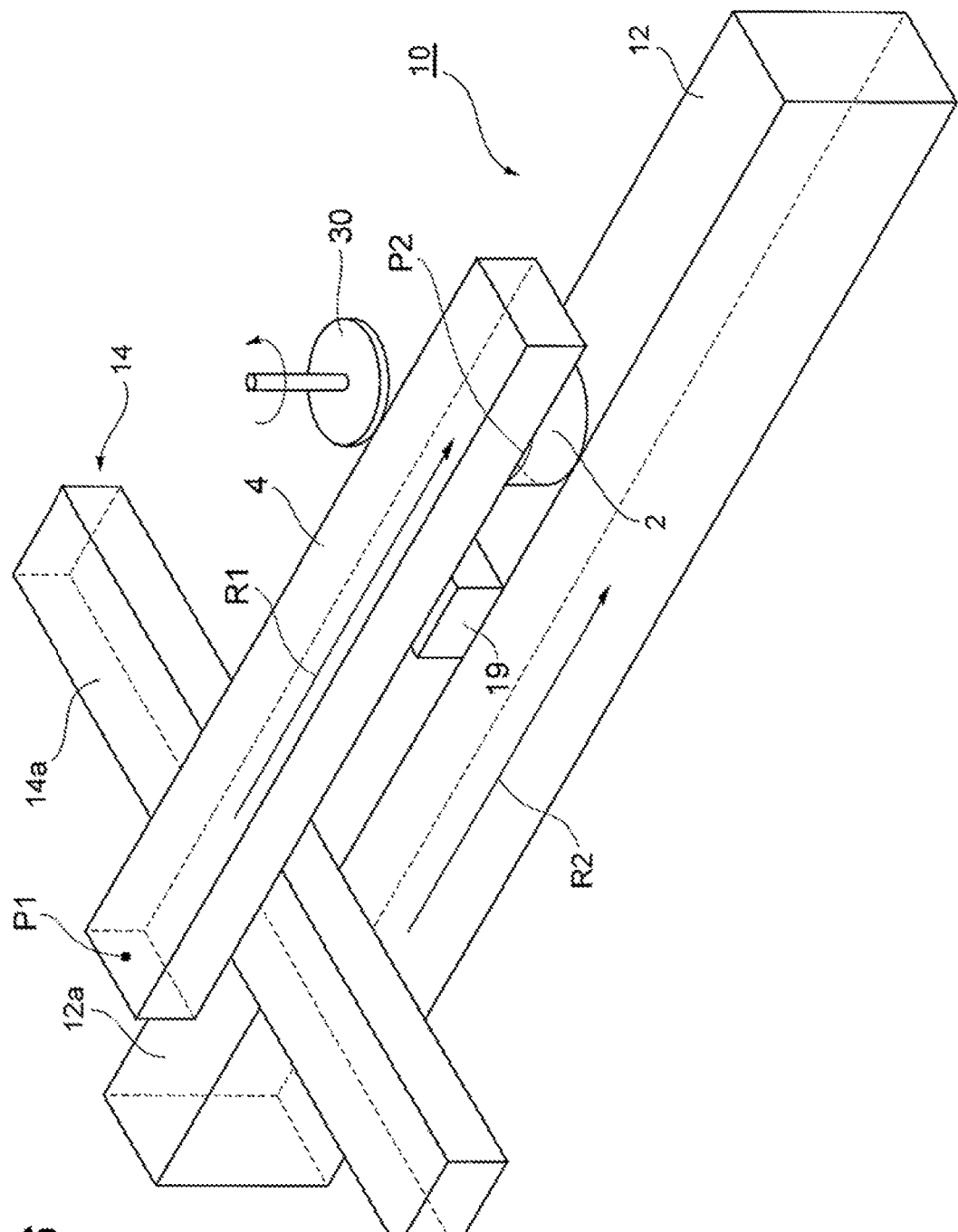
FIG. 6 is an enlarged view of the spin device according to the second embodiment.
Figure 7:
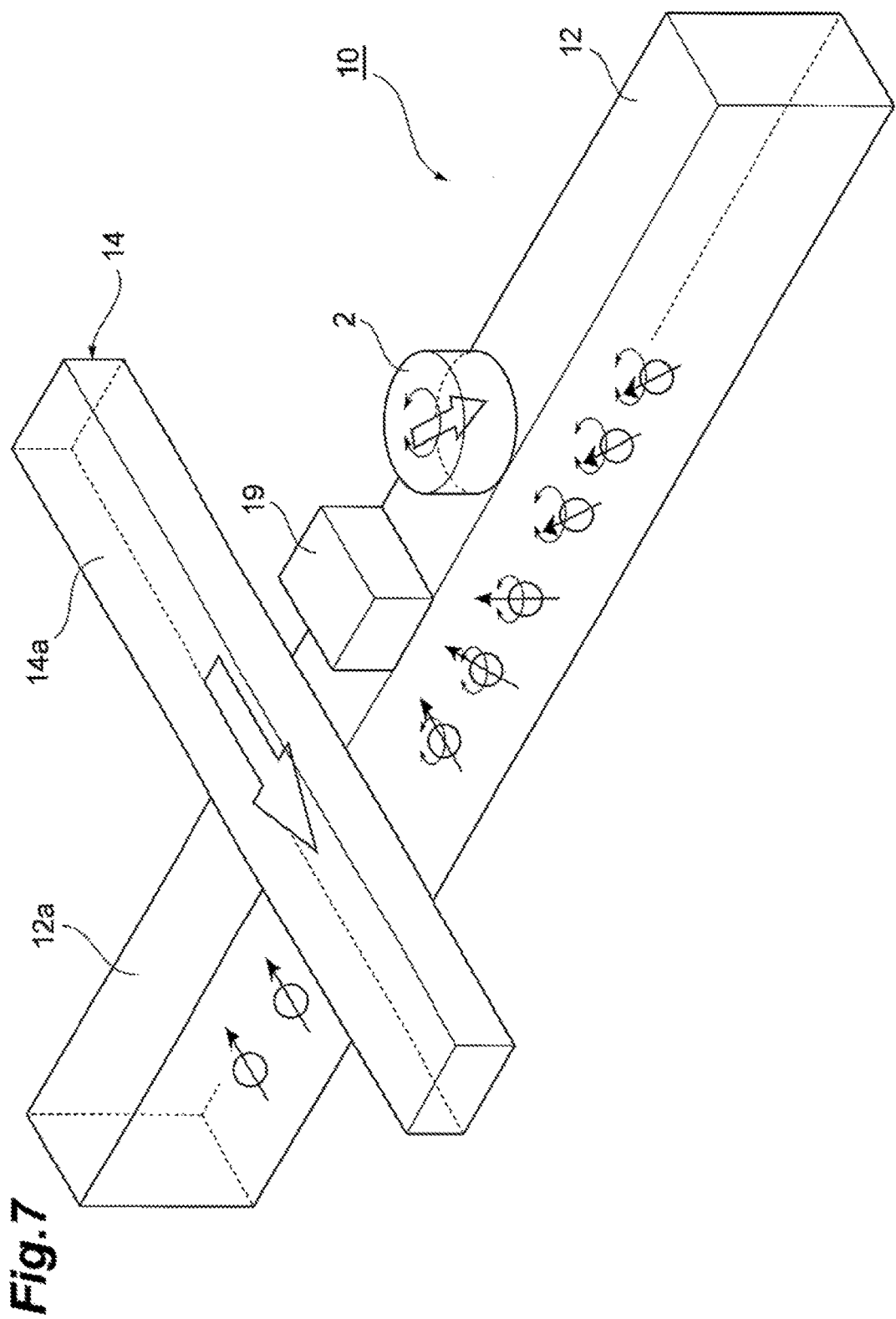
FIG. 7 is a schematic view for describing an operation principle of a spin device.

The spin device 10 according to the present embodiment will be described with reference to FIGS. 4 to 7. FIG. 4 is a perspective view of the spin device 10 according to an embodiment. FIG. 5 is a sectional view along line II-II of FIG. 4. FIG. 6 is an enlarged view of the spin device 10 according to an embodiment. FIG. 7 is a schematic view for describing an operation principle of the spin device 10.

As illustrated in FIG. 4, the spin device 10 includes, for example, a second channel portion 12, a spin injector 14, a spin rotation control portion 19, and a spin portion 2. Here, an in-plane spin valve structure is formed in which a spin injector 14 made of a ferromagnetic body and a spin portion 2 made of a ferromagnetic body are bridged by a second channel portion 12 made of a nonmagnetic body. The spin injector 14 and the spin portion 2 can be formed of Fe, NiFe, and the like. The second channel portion 12 can be formed of a semiconductor material of Si or gallium arsenide (GaAs), or a nonmagnetic metal such as Ag or Cu. Hereinafter, a case in which the second channel portion 12 is formed of the semiconductor material will be described.

As illustrated in FIGS. 4 and 5, the second channel portion 12 is arranged on a substrate 24. As the substrate 24, a semiconductor substrate is used, for example. The second channel portion 12 is a linear member, and is arranged such that its axial line direction faces an in-plane direction of the substrate 24. The second channel portion 12 is formed by processing a semiconductor layer 20 layered on the substrate 24 in a mesa manner. A line width of the second channel portion 12 is 10 μm or less, for example. In a case where a two-dimensional electronic gas layer 22 is formed between the substrate 24 and the semiconductor layer 20, the second channel portion 12 may be formed by processing the two-dimensional electronic gas layer 22 and the semiconductor layer 20 in a mesa manner. For example, in a case where a GaAs substrate is used as the substrate 24, and the semiconductor layer 20 is formed by doping the substrate 24 with electrons, the two-dimensional electronic gas layer 22 is formed between the semiconductor layer 20 and the substrate 24.

The spin injector 14 is provided on the substrate 24. The spin injector 14 is a linear member, is arranged such that its axial line direction faces the in-plane direction of the substrate 24, and is magnetized in the in-plane direction. Note that, here the spin injector 14 is arranged on the second channel portion 12. The spin injector 14 is arranged to intersect with the second channel portion 12. Therefore, the spin injector 14 and the second channel portion 12 are in contact with each other (directly joined). An area where the spin injector 14 and the second channel portion 12 intersect with each other is a spin injection area (spin injection position). A line width of the spin injector 14 is 10 µm or less, for example.

The spin portion 2 is provided on the substrate 24 being separated from the spin injector 14. The spin portion 2 is a disk member, and is formed such that a magnetic moment faces an in-substrate direction. Note that the disk member means a member having a shape with a horizontal section that does not include an acute-angle portion. The disk member includes not only a plate member with a circular horizontal section, but also a member with an elliptical horizontal section, a member with a polygonal horizontal section, in which angles are large close to 180 degrees, a dot-shaped member, and a conical member. Here, the spin portion 2 is arranged on the second channel portion 12. The spin portion 2 is in contact with (directly joined with) the second channel portion 12. The diameter of the spin portion 2 is 10 µm or less, for example. Here, the spin portion 2 is formed such that the diameter becomes smaller than the line width of the second channel portion 12.

As described above, the spin device 10 is an in-plane spin valve structure in which the second channel portion 12 is arranged between the spin injector 14 and the spin portion 2. A terminal portion 14a for current or voltage application is formed in one end portion of the spin injector 14, and a terminal portion 12a for current or voltage application is formed in one end portion (an end portion closer to the spin injector 14, of both end portions) of the second channel portion 12.

The spin rotation control portion 19 includes a voltage control unit and a voltage application terminal (not illustrated). The spin rotation control portion 19 is connected to the second channel portion 12. For example, the spin rotation control portion 19 is directly joined with an area on the second channel portion 12, and is an area positioned between the spin injector 14 and the spin portion 2. The spin rotation control portion 19 is configured to be able to apply an electric field or a magnetic field to the second channel portion 12 in order to control a rotating direction of the spin of the second channel portion 12. The spin rotation control portion 19 exhibits an approximately rectangular parallelepiped, and a width in a direction perpendicular to a longitudinal direction of the second channel portion 12 is 10 µm or less, for example. Note that, here, the spin portion 2 is formed such that the width in the direction perpendicular to the longitudinal direction of the second channel portion 12 becomes the line width of the second channel portion 12 or less.

Here, the spin device 10 includes the spin control mechanism 1. The spin control mechanism 1 is similar to that of the first embodiment, and includes the spin portion 2 and the first channel portion 4. The first channel portion 4 may extend in approximately parallel to the second channel portion 12, for example. Further, the other end portion of the first channel portion 4 may be arranged on the spin injector 14. Note that, in this case, a heat insulating material may be provided between the first channel portion 4 and the spin injector 14. Other configurations and modifications of the first channel portion 4 are similar to those of the first embodiment, and thus description is omitted.

FIG. 6 is a diagram illustrating the spin device 10 that functions as a spin motor. As illustrated in FIG. 6, the spin device 10 includes a motor rotor 30. The motor rotor 30 is formed of a ferromagnetic material, and is arranged above the spin portion 2, being separated from and facing the spin portion 2. The motor rotor 30 may just be arranged within a range where a leaked magnetic field of the spin portion 2 is transmitted, and is arranged in a range of several tens nm or less from the spin portion 2, for example. That is, the motor rotor 30 is arranged in a position where the motor rotor 30 is rotatable following the magnetic moment of the spin portion 2. The motor rotor 30 exhibits an approximately disk shape, and is arranged such that a rotation axis thereof becomes perpendicular to the substrate 24. Note that the shape of the motor rotor 30 is not limited to the approximately disk shape, and may be, for example, a rod-like member. A rod-like member or the like that transmits rotary movement of the motor rotor 30 is connected to the motor rotor 30. A diameter of the motor rotor 30 is 10 µm or less, for example.

An operation of the spin device 10 having the above configuration will be described. As illustrated in FIG. 6, the magnetic moment of the spin portion 2 is controlled by a spin current R1 flowing in the first channel portion 4 and a spin current R2 flowing in the second channel portion 12. Note that the spin current R2 flowing in the second channel portion 12 mainly controls the magnetic moment of the spin portion 2, and the spin current R1 flowing in the first channel portion 4 assists easier control of the magnetic moment of the spin portion 2 by the spin current R2. That is, the spin control mechanism 1 functions as an assist mechanism of magnetization reversal of an in-plane spin valve element.

Firstly, the spin current R2 flowing in the second channel portion 12, which is related to main control, will be generally described.

FIG. 7 is a schematic view for describing the spin current R2 flowing in the second channel portion 12. In FIG. 7, the first channel portion 4 is omitted, in consideration of easy understanding of the description. First, a current is applied between the terminal portion 14a of the spin injector 14 and the terminal portion 12a of the second channel portion 12. Accordingly, spin that is antiparallel to the magnetizing direction of the spin injector 14 is injected into the second channel portion 12, as illustrated in FIG. 7. The spin injected into the second channel portion 12 is diffused to both end portions of the second channel portion 12. At this time, spin antiparallel to the diffused spin flows from the spin portion 2 side to the spin injector 14 side. Therefore, a spin current without accompanying electric changes is generated from the spin injector 14 side toward the spin portion 2 side. The spin flowing in the second channel portion 12 performs precession by spin-orbit interaction, and this spin-orbit interaction is controlled by the electric field by the voltage applied by the spin rotation control portion 19. That is, the direction of the spin flowing in the second channel portion 12 is changed by the applied voltage of the spin rotation control portion 19. Here, the direction of the spin is changed to be gradually rotated in the in-substrate direction by AO at a time according to time. That is, the direction of the spin of the spin current arriving at the spin portion 2 is rotated in the in-substrate direction by AO at a time in time series. The spin of the second channel portion 12 provides spin-transfer torque to the magnetic moment of the spin portion 2. Therefore, the direction of the spin of the spin current is rotated in time series, so that the magnetic moment of the spin portion 2 is rotated. At this time, as illustrated in FIG. 6, the motor rotor 30 is rotated following the magnetic moment of the spin portion 2. At this time, the rotation of the magnetic moment is converted into kinetic energy, so that the motor rotor 30 can be driven as a spin motor. Further, for example, in a case where a shape such as elliptical shape having a difference in length of an axis is employed as the horizontal section of the spin portion 2, the magnetic moment is more likely to face a major axis direction.

Therefore, the direction of an initial magnetic moment can be controlled.

Next, the spin current R1 flowing in the first channel portion 4 related to the assist mechanism will be generally described. In a case of controlling the direction of the magnetic moment of the spin portion 2, heat is supplied from a heat generating source 15 to a predetermined position P1 of the first channel portion 4. Accordingly, a temperature gradient is generated between the predetermined position P1 and a contact position P2. The first channel portion 4 is configured from a ferromagnetic insulator, and thus the spin is excited in the ferromagnetic insulator by spin Seebeck effect, and the spin current R1 is generated. The spin current R1 is generated from the predetermined position P1 toward the contact position P2 having a lower temperature than the predetermined position P1. This spin current R1 acts on the magnetic moment of the spin portion 2 as the spin-transfer torque. Accordingly, in controlling the magnetic moment of the spin portion 2 by the spin current R2, the spin current R1 also acts on the magnetic moment of the spin portion 2 as the spin-transfer torque. Accordingly, the magnetic moment of the spin portion 2 can be easily rotated by the spin current R1 of the first channel portion 4.

Figure 8:
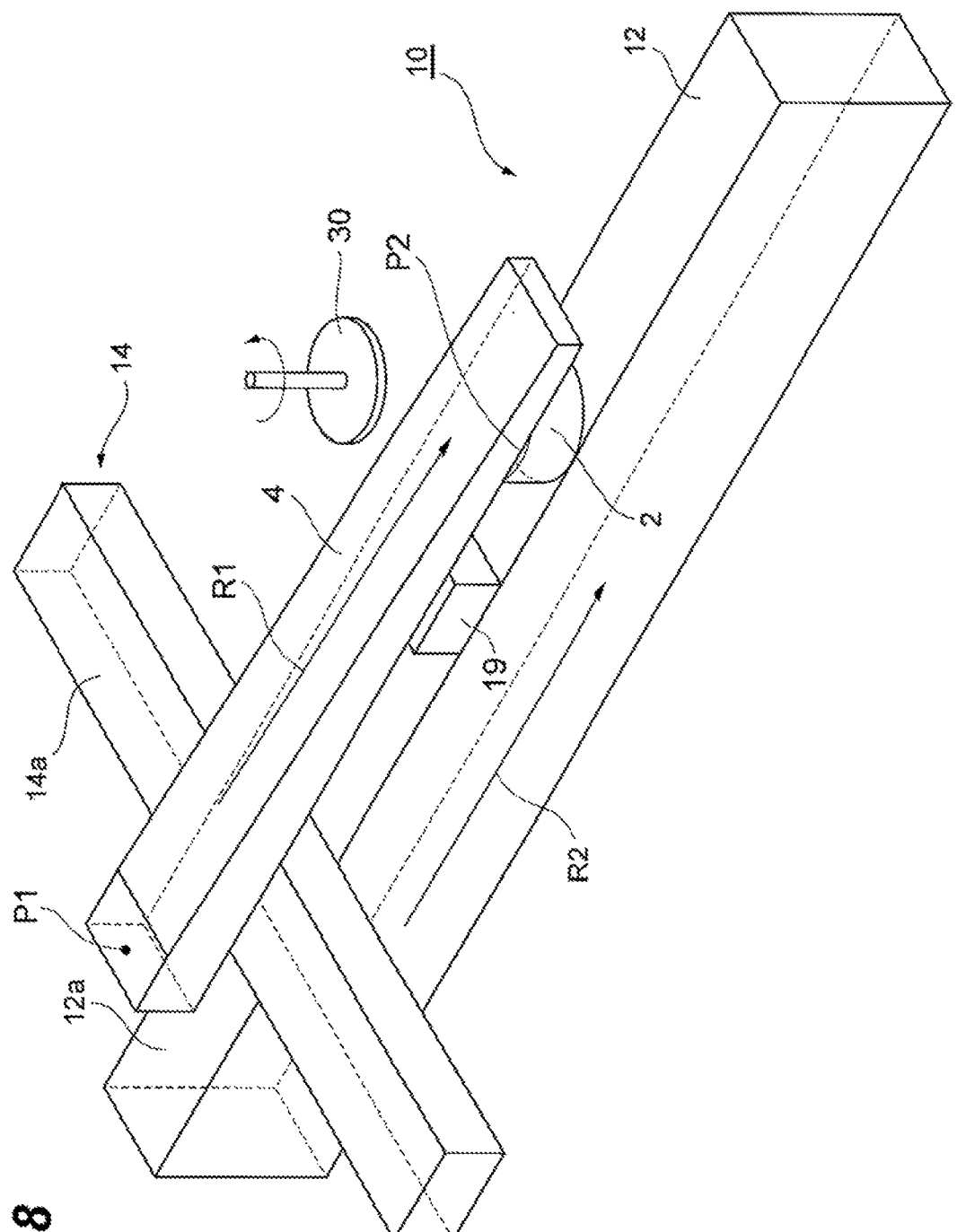
FIG. 8 is an enlarged view illustrating a modification of the spin device according to the second embodiment.

Further, in the present embodiment, as illustrated in FIG. 8, the first channel portion 4 may be formed such that the thickness becomes thinner from the predetermined position P1 toward the contact position P2. For example, the thickness of the first channel portion 4 in the predetermined position P1 may be thicker than the thickness of the contact position P2 being in contact with the spin portion 2. Then, the thickness of the first channel portion 4 may become gradually thinner toward the contact position P2 being in contact with the spin portion 2. With the configuration, the heat capacity of each position is changed from the predetermined position P1 toward the contact position P2. Therefore, the temperature gradient can be efficiently formed from the predetermined position P1 toward the contact position P2 of the first channel portion 4. Accordingly, for example, making the temperature of the predetermined position P1 higher than the temperature of the contact position P2 can be easily realized. Therefore, the magnetic moment 3 of the spin portion 2 can be efficiently controlled.

As described above, according to the spin device 10 according to the second embodiment, the magnetic moment 3 of the spin portion 2 can be controlled using the heat. Therefore, the spin device 10 can be used for further downsizing or energy-saving of the mechanism that adjusts the temperature of electronic components. For example, by use of heat generated from another electronic component as the heat generating source 15, the mechanism that adjusts the temperature of electronic components can be further downsized or energy-saved.

Third Embodiment

A spin device 10 according to a third embodiment includes a spin control mechanism 1 similar to the spin device according to the first embodiment. The spin device 10 according to the third embodiment is different from the spin devices according to the first and second embodiments in that a so-called perpendicular-to-surface spin valve structure is included. Therefore, points overlapping with the description of the first and second embodiments are omitted, and the different point will be mainly described.

Figure 9:
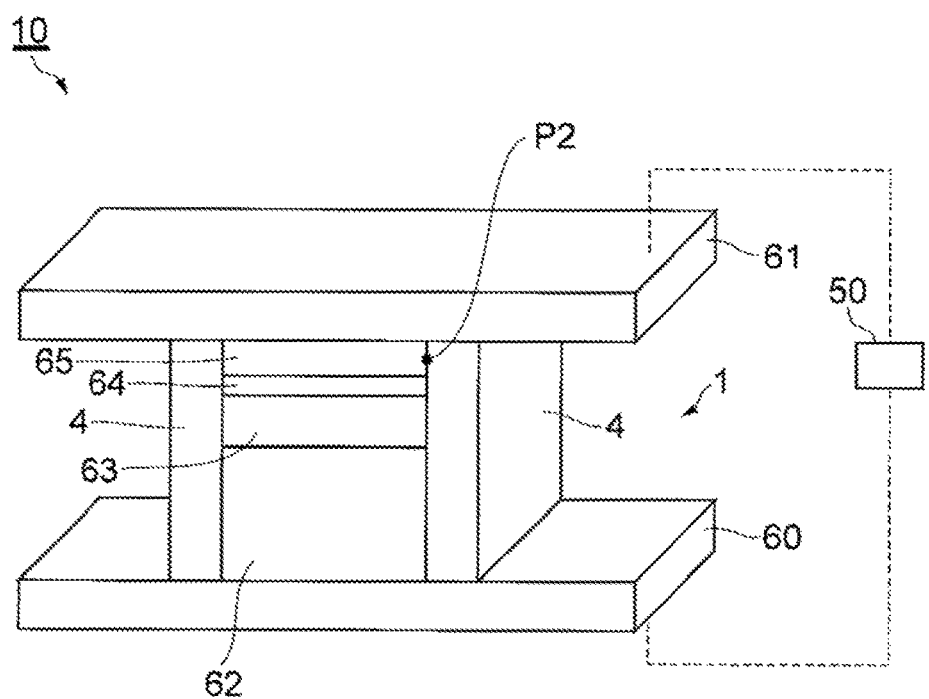
FIG. 9 is a perspective view of a spin device according to a third embodiment.

As illustrated in FIG. 9, the spin device 10 includes substrates 60 and 61, an antiferromagnetic layer 62, a pinned layer 63, an intermediate layer 64, a free layer 65, a first channel portion 4, and a potential difference generating portion 50, for example. The pinned layer 63, the intermediate layer 64, and the free layer 65 form a spin valve structure.

The substrate 60 can be formed of a semiconductor material of Si or gallium arsenide (GaAs), or a nonmagnetic metal such as MgO, Ag, or Cu. The antiferromagnetic layer 62 made of an antiferromagnetic body is layered on the substrate 60. The pinned layer 63 is layered on the antiferromagnetic layer 62. The pinned layer 63 is made of a magnetic body. The direction of a magnetic moment of the pinned layer 63 is fixed to one direction by exchange coupling of the magnetic moment of the pinned layer 63 and the antiferromagnetic layer 62. The pinned layer 63 is formed of a ferromagnetic material. As the ferromagnetic material, Fe, Co, Ni, or the like is used. Magnetization of the pinned layer 63 can be fixed to an arbitrary first direction. The first direction is, for example, a perpendicular-to-substrate direction (direction perpendicular to a substrate surface).

The intermediate layer 64 is provided on the pinned layer 63. The intermediate layer 64 may be, for example, a tunnel barrier layer for tunnel coupling of a spin valve structure. In this case, the intermediate layer 64 is formed of an insulator material, for example. As the insulator material, $SiO_2$, $Al_2O_3$, CoFeO, or the like is used. Further, the intermediate layer 64 may be, for example, a nonmagnetic layer. The nonmagnetic layer is made of nonmagnetic metal of MgO, Ag, Cu, or the like.

The free layer 65 is provided on the intermediate layer 64. The free layer 65 is formed of a ferromagnetic material. As the ferromagnetic body, Fe, Co, Ni, or the like is used. The free layer 65 can change the direction of the magnetic moment. Magnetic anisotropy of the free layer 65 is, for example, a perpendicular-to-substrate direction (a direction perpendicular to a substrate surface). That is, the free layer 65 is configured to be able to perform magnetization reversal in the perpendicular-to-substrate direction. The substrate 61 that functions as a cap layer is arranged on the free layer 65. The substrate 61 can be formed of a semiconductor material of Si, gallium arsenide (GaAs), or the like, or a nonmagnetic metal such as MgO, Ag, or Cu. Further, an electrode may be formed in at least a part of the substrate 61. This electrode can be formed of a nonmagnetic metal of MgO, Ag, Cu, or the like.

As described above, the spin device 10 has the pinned layer 63 and the free layer 65 layered across the intermediate layer 64 to become a layered structure that exerts tunnel magnetoresistance (TMR) or giant magnetoresistance (GMR) effect. The substrates 60 and 61 are provided with terminals for voltage application, respectively, and the potential difference generating portion 50 is connected to the terminals. The potential difference generating portion 50 provides a potential difference between the pinned layer 63 and the free layer 65. A resistance value between the substrates 60 and 61 is changed according to the direction of the magnetic moment of the free layer 65. In a case where the intermediate layer 64 is mainly configured from an insulator, the resistance value is changed according to the direction of the magnetic moment of the free layer 65 by the tunnel magnetoresistance (TMR) in the spin device 10. Meanwhile, in a case where the intermediate layer 64 is mainly configured from a nonmagnetic body, the resistance value is changed according to the direction of the magnetic moment of the free layer 65 by the giant magnetoresistance (GMR) in the spin device 10. The direction of the magnetic moment of the free layer 65 can be controlled by spin excited by electrons injected into the pinned layer. Further, by application of a current to the spin valve structure, Joule heat is generated. For example, in a case where the current flows from the substrate 60 side to the substrate 61, Joule heat is generated, and a spin current is generated in the same direction as the direction into which the current flows.

Here, a first channel portion 4 is arranged in contact with sides of the layered pinned layer 63, intermediate layer 64, and free layer 65. The spin control mechanism 1 is configured, including the free layer 65 and the first channel portion 4. This spin control mechanism 1 is the same as the spin control mechanism according to the first embodiment. Therefore, description is omitted.

End portions of the first channel portion 4 in a vertical direction are connected to the substrate 60 and the substrate 61, respectively. Therefore, when a voltage is applied to the layered structure including the spin valve structure, Joule heat is generated in the layered structure. The generated Joule heat is conducted to the first channel portion 4 arranged at the side of the layered structure. At this time, the temperature of the substrate 60 side, that is, the pinned layer 63 side is higher than the temperature of the substrate 61 side, that is, the free layer 65 side. Accordingly, a temperature gradient can be caused in the first channel portion 4 from a contact position of the first channel portion 4 and the pinned layer 63 toward a contact position of the first channel portion 4 and the free layer 65. Therefore, spin is excited in the first channel portion 4, and a spin current is generated. The spin current acts on the magnetic moment of the free layer 65 as spin-transfer torque. At this time, the magnetic moment of the free layer 65 can be more easily controlled by the spin current of the first channel portion 4. That is, the spin control mechanism 1 according to the present embodiment functions as an assist mechanism, similarly to the spin control mechanism according to the second embodiment. As described above, the first channel portion 4 can easily control the direction of the magnetic moment of the free layer 65 using the heat generated in an electronic component.

Figure 10:
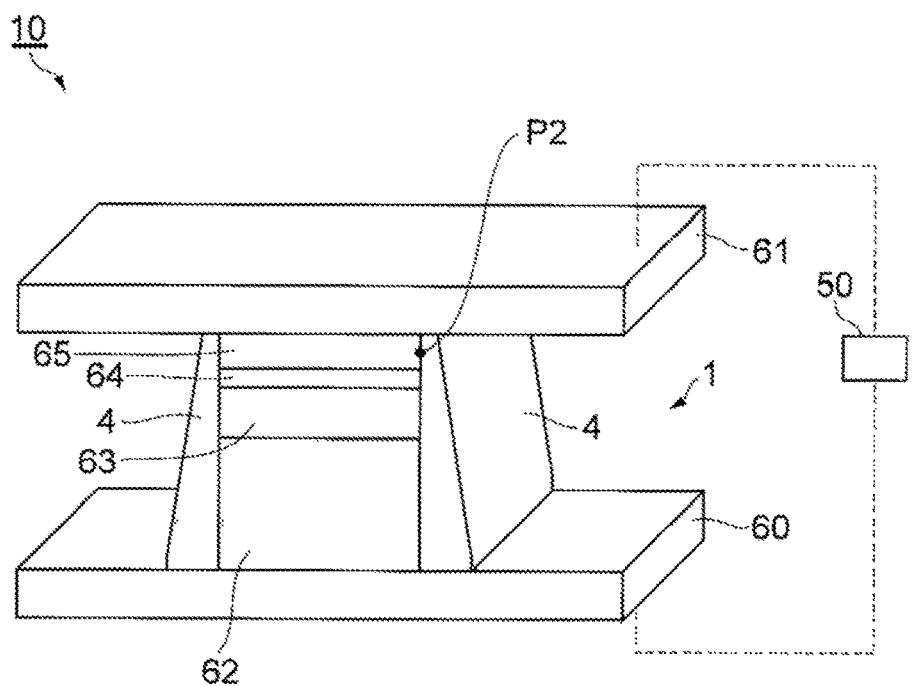
FIG. 10 is a perspective view illustrating a modification of the spin device according to the third embodiment.
Figure 11:
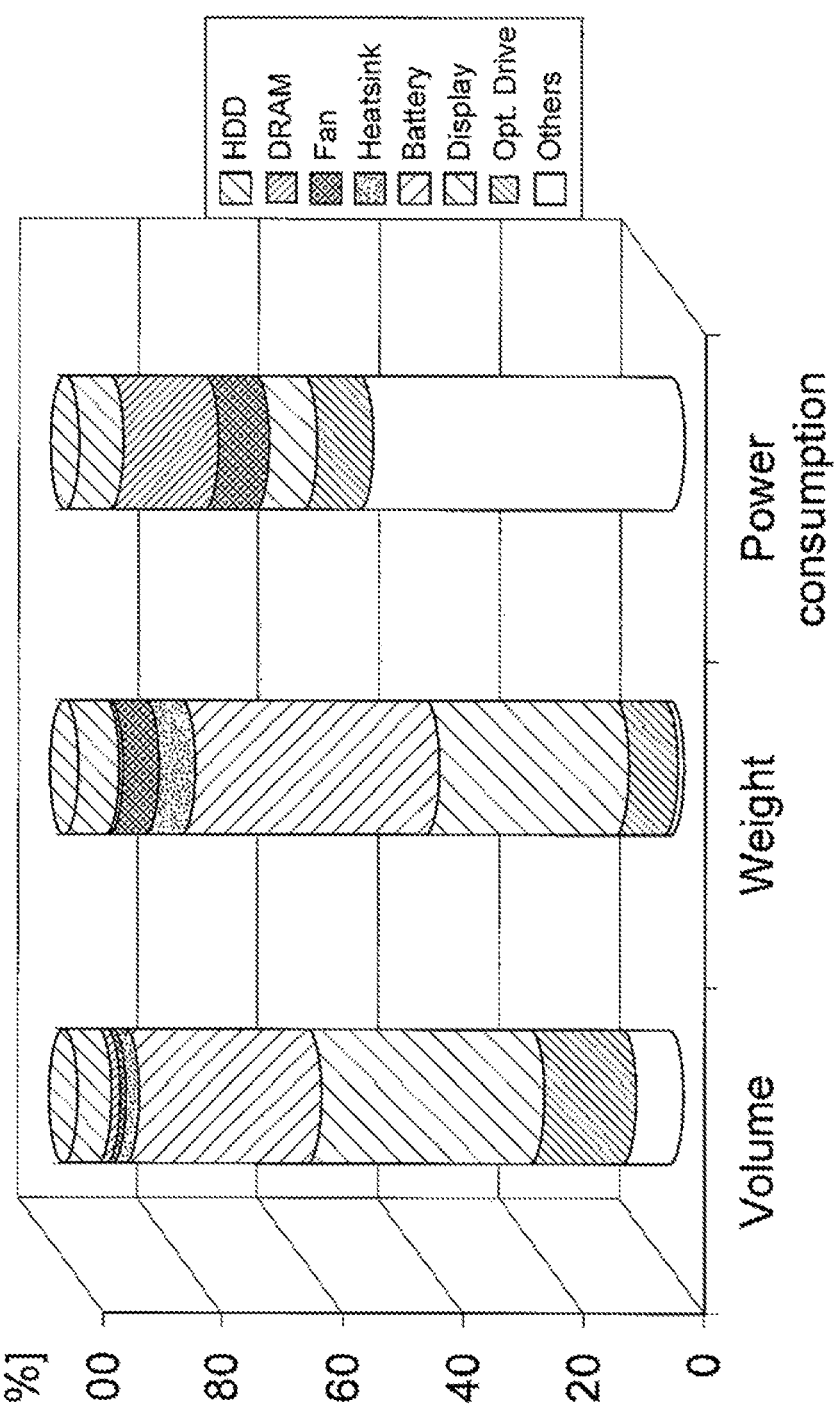
FIG. 11 is a diagram illustrating volume ratios, weight ratios, and power consumption ratios of a fan and a heatsink in a lap-top computer.

Further, as illustrated in FIG. 10, in the present embodiment, a gradient of the thickness of the first channel portion 4 may be formed such that the thickness becomes thinner from the pinned layer 63 side toward a contact position P2 of the first channel portion 4 and the free layer 65. The thickness of the first channel portion 4 at the pinned layer 63 side may be thicker than the thickness of the contact position P2 being in contact with the free layer 65. In this case, for example, a point included in the contact surface where the first channel portion 4 and the free layer 65 are in contact may be employed as the contact position P2. The size of the contact surface is not limited, and the first channel portion 4 and the free layer 65 may be in contact at one point.

With the configuration, heat capacity of each position of the first channel portion 4 is changed toward the free layer 65. Therefore, the temperature gradient can be efficiently formed from the pinned layer 63 side of the first channel portion 4 toward the contact position. Therefore, the magnetic moment of the free layer 65 can be efficiently controlled.

The first channel portion 4 in which the gradient of the thickness is formed can be appropriately manufactured by a sputtering device. The first channel portion 4 is manufactured such that one of a film formation sample and a target is arranged in parallel to a horizontal plane, and the other is arranged inclined from the horizontal plane. In this state, sputtering is performed, so that change is given to the thickness and a film can be formed.

As described above, according to the spin device 10 of the third embodiment, the magnetic moment of the free layer 65 can be easily controlled using the heat generated by the spin valve element. Therefore, a mechanism that adjusts the temperature of electronic components, which employs the spin valve element, can be further downsized or energy-saved.

The above-described embodiments can be made into various modifications.

For example, the above-described embodiments have been described to include the case where the sizes of the configuration members of the spin device 10 are micro-order members. However, the sizes of the configuration members may be formed in the nano order, and a nanoscale spin device 10 may be formed.

Further, in the above-described second embodiment, an example in which the spin injector 14, the spin rotation control portion 19, and the spin portion 2 are directly joined with the second channel portion 12 has been described. However, at least one of the spin injector 14, the spin rotation control portion 19, and the spin portion 2 may be joined with the second channel portion 12 through an insulating layer. Even this configuration can function as the spin device 10.

Further, in the above-described second embodiment, an example in which the spin injector 14 and the spin portion 2 are arranged above the second channel portion 12 has been described. However, the spin injector 14 and the spin portion 2 may be arranged in any manner as long as at least a part of the spin injector 14 and the spin portion 2 is in contact with the second channel portion 12. That is, the spin injector 14 and the spin portion 2 may be arranged at a side of the second channel portion 12. Further, the spin portion 2 may have the line width of the second channel portion 12 or more.

Further, in the above-described second embodiment, an example in which the first channel portion 4 is arranged above the spin portion 2 has been described. However, the spin injector 14 and the spin portion 2 may be arranged in any manner as long as at least a part of the spin injector 14 and the spin portion 2 is in contact with the first channel portion 4. That is, the spin injector 14 and the spin portion 2 may be arranged at a side of the first channel portion 4.

Further, in the above-described second embodiment, an example of applying a current to the second channel portion 12 as the spin rotation control portion 19 has been described. However, another spin rotation control portion may be employed. For example, an irradiation portion that irradiates the second channel portion 12 with circular polarization may be employed as the spin rotation control portion 19. Note that, in this case, the second channel portion 12 is formed of a semiconductor material. With this formation, the direction of the spin can be controlled using the circular polarization. Therefore, the number of components that are in contact with the second channel portion 12 can be decreased.

Further, a control unit that changes the voltage value applied to the spin injector 14 may be employed as the spin rotation control portion 19. In an interface between the ferromagnetic metal and the semiconductor, a Schottky barrier is formed, and when energy of electrons and a resonance level are matched, a large current flows. By change of the voltage value to be applied to the spin injector 14, the resonance level generated in the ferromagnetic metal/semiconductor interface can be changed. Therefore, the direction of the spin of the second channel portion 12 can be controlled with the applied voltage to the spin injector.

With this formation, the number of components that are in contact with the second channel portion 12 can be decreased.

Further, in the above-described second embodiment, an example of generating the spin current without accompanying a flow of electric charges by a so-called non-local technique, and rotating the spin portion 2 has been described. However, a terminal portion 12a for current application may be formed in an end portion of the second channel portion 12 close to the spin portion 2, and a spin current accompanying the flow of electric charges may be generated by a so-called local technique, and magnetic moment of the spin portion 2 may be rotated. In this case, current density can be made larger than the case of the non-local technique, and thus the spin torque can be made large. Therefore, the magnetic moment of the spin portion 2 can be efficiently rotated.

Further, in the above-described second embodiment, an example in which the motor rotor 30 is arranged, being separated from and facing the spin portion 2, has been described. However, the arrangement is not limited to the case where the spin portion 2 and the motor rotor 30 are separated. For example, the spin portion 2 and the motor rotor 30 may be connected through a bearing or the like. Even in this case, the configuration can function as a spin motor.

Further, in the third embodiment, the first channel portion 4 may be separately connected to the heat generating source 15.

INDUSTRIAL APPLICABILITY

The spin device 10 has industrial applicability as follows. The spin device 10 can be used in the field of micro electro mechanical systems (MEMS) or nano electro mechanical systems (NEMS) as a power source for motor that drives micro motor, like the spin device 10 according to the embodiments. Further, the spin device 10 can be used as a device component and a motor in the electronic/electric field and in the medical field. Further, the spin device 10 can be used as an electrical/electronic component in the industrial fields. For example, the spin device 10 is applicable to gate control in ferromagnetic body/semiconductor hybrid structures such as memory devices or vertical nanopillars.

REFERENCE SIGNS LIST

1 . . . Spin control mechanism, 10 . . . Spin device, 2 . . . Spin portion, 4 . . . First channel portion, 12 . . . Second channel portion, 14 . . . Spin injector, 15 . . . Heat generating source, 24 . . . Substrate, 50 . . . Potential difference generating portion. 63 . . . Pinned layer, 64 . . . Intermediate layer, 65 . . . Free layer, P1 . . . Predetermined position, P2 . . . Contact position.

The invention claimed is:

1. A spin control mechanism that controls a direction of a magnetic moment, the spin control mechanism comprising:
    a spin portion having the magnetic moment; and
    a first channel portion provided in contact with the spin portion and configured from a ferromagnetic insulator,
    wherein a gradient of a thickness is formed in the first channel portion such that the thickness becomes thinner from a predetermined position of the first channel portion toward a contact position of the first channel portion and the spin portion,
    wherein the predetermined position of the first channel portion and a heat generating source are thermally connected in order to provide a temperature gradient between the predetermined position of the first channel portion and the contact position where the first channel portion and the spin portion are in contact with each other, and
    wherein the direction of the magnetic moment of the spin portion is controlled using a spin current generated by the temperature gradient provided to the first channel portion.

2. The spin control mechanism according to claim 1, wherein the temperature gradient in which a temperature becomes lower toward the contact position of the first channel portion and the spin portion is provided to the first channel portion.

3. The spin control mechanism according to claim 1, wherein the heat generating source generates Joule heat.

4. The spin control mechanism according to claim 1, wherein the heat generating source is a heatsink connected to another electronic device.

5. A spin device that is operated by a spin current, the spin device comprising:
    a spin portion having a magnetic moment;
    a spin injector provided separated from the spin portion, and made of a magnetic body;
    a first channel portion provided in contact with the spin portion, and configured from a ferromagnetic insulator; and
    a second channel portion arranged between the spin injector and the spin portion, and made of a nonmagnetic body joined with the spin injector and the spin portion directly or through an insulating layer,
    wherein a direction of the magnetic moment of the spin portion is controlled using at least one of a spin current generated in the first channel portion by a temperature gradient provided to the first channel portion, and a spin current generated in the second channel portion by application of a current or a voltage to the spin injector and the second channel portion,
    wherein a predetermined position of the first channel portion and a heat generating source are thermally connected in order to provide the temperature gradient between the predetermined position and a contact position where the first channel portion and the spin portion are in contact with each other, and
    wherein a terminal portion is formed in one end portion of the spin injector and a terminal portion is formed in one end portion of the second channel portion for application of the current or the voltage to the spin injector and the second channel portion.

6. The spin device according to claim 5, wherein the temperature gradient in which a temperature becomes lower toward the contact position of the first channel portion and the spin portion is provided to the first channel portion.

7. The spin device according to claim 5, wherein a gradient of a thickness is formed in the first channel portion such that the thickness becomes thinner from a predetermined position of the first channel portion toward a contact position of the first channel portion and the spin portion.

8. The spin device according to claim 5, wherein the heat generating source generates heat by Joule heat.

9. The spin device according to claim 5 wherein the heat generating source is a heatsink connected to another electronic device.

10. The spin device according to claim 5, further comprising:
a substrate; wherein
the spin portion is a disk-like member made of a ferromagnetic body provided on the substrate, and
the spin injector is provided on the substrate, being separated from the spin portion, and is made of a ferromagnetic body magnetized in an in-substrate direction.

* * * * *